United States Patent
Tanaka et al.

(10) Patent No.: US 12,426,287 B2
(45) Date of Patent: Sep. 23, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Akihiro Tanaka, Himeji Hyogo (JP); Tetsuhiro Saisho, Himeji Hyogo (JP); Toru Shono, Himeji Hyogo (JP); Koji Onishi, Ibo Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 586 days.

(21) Appl. No.: 17/410,937

(22) Filed: Aug. 24, 2021

(65) Prior Publication Data

US 2022/0085192 A1    Mar. 17, 2022

(30) Foreign Application Priority Data

Sep. 16, 2020 (JP) .................................. 2020-155203
Jul. 19, 2021 (JP) .................................. 2021-118602

(51) Int. Cl.
*H10D 12/00* (2025.01)
*H10D 62/10* (2025.01)

(52) U.S. Cl.
CPC ......... *H10D 12/481* (2025.01); *H10D 62/125* (2025.01)

(58) Field of Classification Search
CPC ............. H01L 29/7397; H01L 29/0688; H01L 29/0696; H01L 29/7811; H01L 29/7813; H01L 21/823481; H01L 27/088; H10D 12/481; H10D 62/125; H10D 30/0245; H10D 30/803; H10D 44/466; H10D 18/60; H10D 30/668; H10D 30/665;
(Continued)

(56) References Cited

U.S. PATENT DOCUMENTS 6,525,375 B1 * 2/2003 Yamaguchi .......... H10D 84/141
257/E29.255
10,355,124 B1    7/2019 Asahara et al.
(Continued)

FOREIGN PATENT DOCUMENTS

CN    101641763 A    2/2010
CN    103151310 A    6/2013
(Continued)

OTHER PUBLICATIONS

Notice of Reasons for Refusal mailed Jul. 3, 2024 in corresponding Japanese Patent Application No. 2021-118602, with English machine translation, 10 pages.
(Continued)

*Primary Examiner* — Yasser A Abdelaziz
(74) *Attorney, Agent, or Firm* — Kim & Stewart LLP

(57) ABSTRACT

A semiconductor part includes a terminal, a first region, and a second region positioned between the first region and the terminal. A ratio of a surface area of a fourth semiconductor layer to a surface area of a third semiconductor layer in the second region is greater than a ratio of a surface area of the fourth semiconductor layer to a surface area of the third semiconductor layer in the first region.

12 Claims, 7 Drawing Sheets

(58) Field of Classification Search
CPC .. H10D 62/127; H10D 84/0149; H10D 84/83; H10D 84/0151; H10D 84/016; H10D 84/038; H10F 77/955; H10H 20/8314; A23B 2/255; A23B 2/783
See application file for complete search history.

(56) References Cited

U.S. PATENT DOCUMENTS

| | | | |
|---|---|---|---|
| 2002/0027237 A1* | 3/2002 | Onishi | H01L 29/7813 257/E29.027 |
| 2004/0262678 A1* | 12/2004 | Nakazawa | H01L 29/1095 257/E29.066 |
| 2008/0164516 A1 | 7/2008 | Darwish | |
| 2008/0164518 A1 | 7/2008 | Darwish | |
| 2008/0164520 A1 | 7/2008 | Darwish | |
| 2008/0166845 A1* | 7/2008 | Darwish | H01L 29/408 257/E21.345 |
| 2008/0191307 A1 | 8/2008 | Darwish | |
| 2010/0264489 A1* | 10/2010 | Ohta | H01L 29/7811 257/334 |
| 2013/0248996 A1 | 9/2013 | Ogasawara et al. | |
| 2014/0151785 A1* | 6/2014 | Akagi | H01L 29/7808 257/329 |
| 2016/0035721 A1* | 2/2016 | Takenaka | H01L 29/41758 257/334 |
| 2016/0372584 A1* | 12/2016 | Kimura | H10D 62/115 |
| 2018/0076290 A1 | 3/2018 | Takayanagi et al. | |
| 2019/0312105 A1 | 10/2019 | Sakurai et al. | |
| 2019/0326432 A1 | 10/2019 | Nakazawa | |
| 2020/0035669 A1 | 1/2020 | Tamaru et al. | |

FOREIGN PATENT DOCUMENTS

| | | |
|---|---|---|
| CN | 103828054 A | 5/2014 |
| JP | 2009-043966 A | 2/2009 |
| JP | 2011-003656 A | 1/2011 |
| JP | 2011003656 * | 1/2011 |
| JP | 2013-201286 A | 10/2013 |
| JP | 2019-169595 A | 10/2019 |
| JP | 2019-192678 A | 10/2019 |
| JP | 6604585 B1 | 11/2019 |
| WO | 2016002083 A1 | 1/2016 |

OTHER PUBLICATIONS

First Office Action mailed Nov. 26, 2024 in Chinese Patent Application No. 202111009463.0, with English machine translation, 20 pages.

Second Office Action mailed May 27, 2025 in counterpart Chinese Patent Application No. 202111009463.0, with English machine translation, 19 pages.

* cited by examiner

SEMICONDUCTOR DEVICE

CROSS-REFERENCE TO RELATED APPLICATIONS

This application is based upon and claims the benefit of priority from Japanese Patent Application No. 2020-155203, filed on Sep. 16, 2020, and Japanese Patent Application No. 2021-118602, filed on Jul. 19, 2021; the entire contents of all of which are incorporated herein by reference.

FIELD

Embodiments described herein relate generally to a semiconductor device.

BACKGROUND

In a semiconductor device that has a vertical structure in which a trench gate controls an on-off operation, a problem occurs in which the breakdown immunity easily decreases because the current easily concentrates particularly in regions proximate to the device terminal (including the corner portions) due to the operation of a parasitic transistor at turn-off. One effective suppression technique is to suppress the operation of the parasitic transistor by reducing the carrier ejection resistance by providing a high-concentration contact layer (hereinafter, called carrier removal (layer)) having the same polarity as the base layer of the transistor. However, the on-resistance is increased if the proportion of the carrier removal region is increased too much.

DETAILED DESCRIPTION

Figure 1:
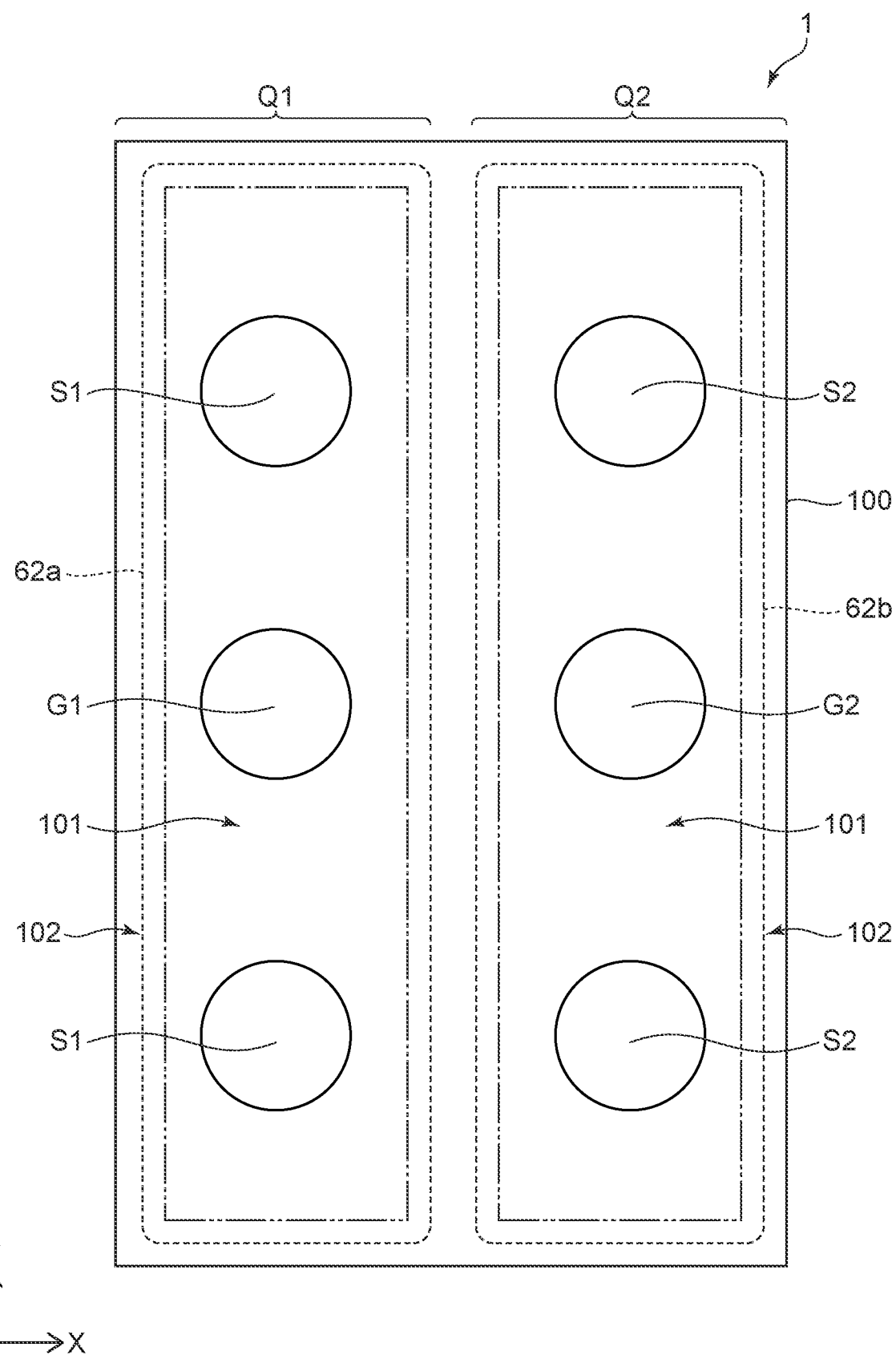
FIG. 1 is a schematic plan view showing one configuration example of a semiconductor device of an embodiment.

According to one embodiment, a semiconductor device includes a semiconductor part, a gate electrode, an insulating film, and an upper electrode. The semiconductor part includes a terminal, a first region, a second region positioned between the first region and the terminal, a first semiconductor layer of a first conductivity type, a second semiconductor layer provided on the first semiconductor layer, the second semiconductor layer being of a second conductivity type, a third semiconductor layer provided on the second semiconductor layer, the third semiconductor layer being of the first conductivity type, and a fourth semiconductor layer provided on the second semiconductor layer, the fourth semiconductor layer being of the second conductivity type and having a higher second-conductivity-type impurity concentration than the second semiconductor layer. A ratio of a surface area of the fourth semiconductor layer to a surface area of the third semiconductor layer in the second region is greater than a ratio of a surface area of the fourth semiconductor layer to a surface area of the third semiconductor layer in the first region. The gate electrode is provided in the semiconductor part. The gate electrode includes a side surface facing the second semiconductor layer. The insulating film is provided between the semiconductor part and the side surface of the gate electrode. The upper electrode is provided on the semiconductor part. The upper electrode contacts the third and fourth semiconductor layers.

According to one embodiment, a semiconductor device includes an upper electrode, a lower electrode, a first semiconductor layer, a second semiconductor layer, a third semiconductor layer, a fourth semiconductor layer, a gate electrode, and an insulating film. The first semiconductor layer is provided in a terminal, in a first region, and in a second region positioned between the first region and the terminal. The first semiconductor layer is of a first conductivity type, and is positioned between the upper electrode and the lower electrode. The second semiconductor layer is provided between the upper electrode and the first semiconductor layer. The second semiconductor layer is of a second conductivity type. The third semiconductor layer is provided between the upper electrode and the second semiconductor layer to contact the upper electrode. The third semiconductor layer is of the first conductivity type. A plurality of the third semiconductor layers is arranged in a second direction crossing a first direction. The first direction is from the lower electrode toward the upper electrode. The fourth semiconductor layer is provided between the upper electrode and the second semiconductor layer to contact the upper electrode. The fourth semiconductor layer is of the second conductivity type. A plurality of the fourth semiconductor layers is arranged in the second direction. A width in the second direction of the second region is greater than a width in the second direction of the first region. The gate electrode includes a side surface facing the second semiconductor layer. The insulating film is provided between the side surface of the gate electrode and the second, third, and fourth semiconductor layers.

Embodiments will now be described with reference to the drawings. The same components in the drawings are marked with the same reference numerals.

FIG. 1 is a schematic plan view showing one configuration example of a semiconductor device 1.

Figure 2:
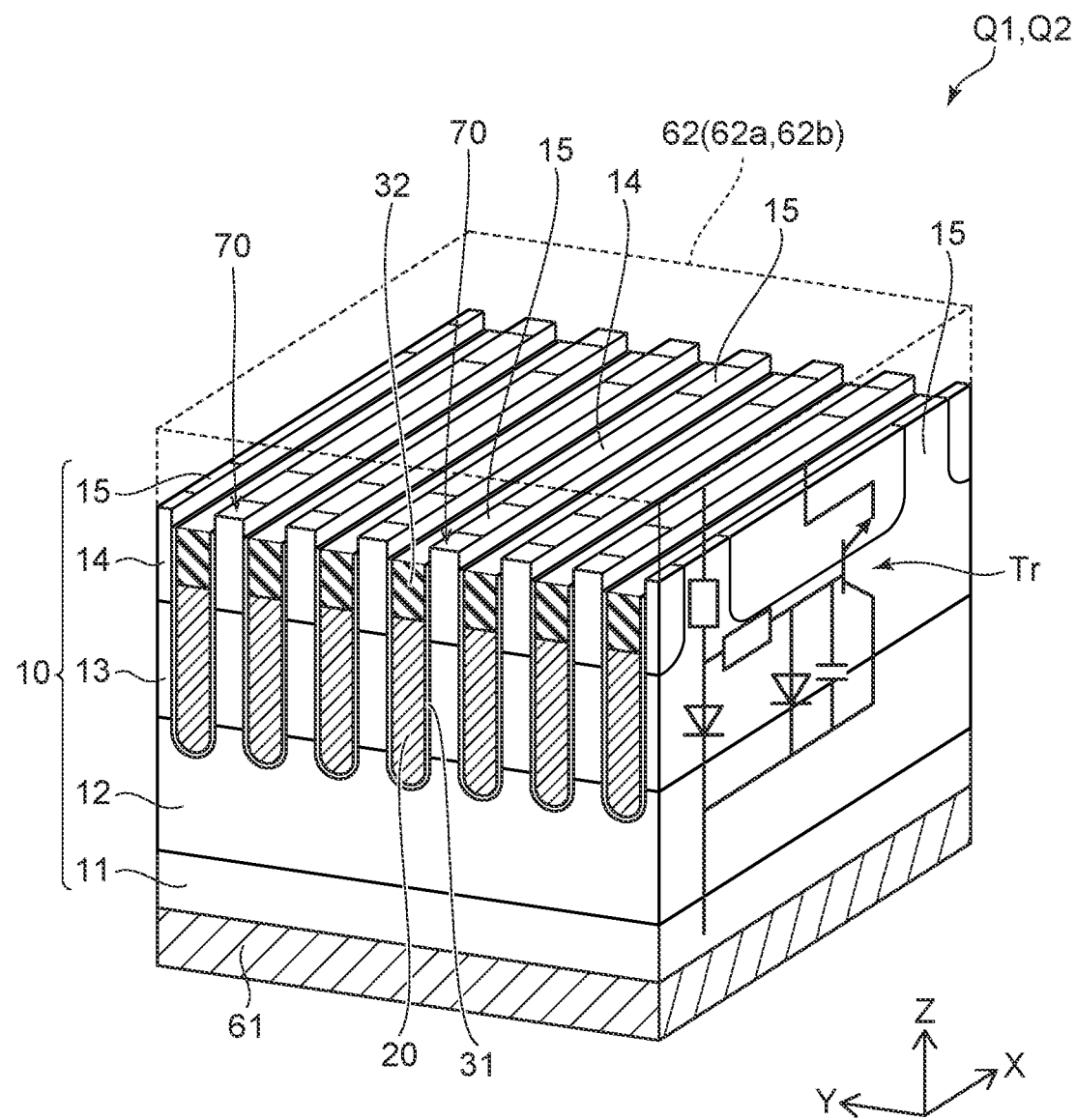
FIG. 2 is a schematic cross-sectional perspective view of the semiconductor device of the embodiment.

FIG. 2 is a schematic cross-sectional perspective view of the semiconductor device 1.

The semiconductor device 1 includes a semiconductor part 10, an upper electrode 62 provided at the upper surface of the semiconductor part 10, and a common electrode (or a lower electrode) 61 provided at the lower surface of the semiconductor part 10.

Two mutually-orthogonal directions in a plane parallel to the upper surface or the lower surface of the semiconductor part 10 are taken as an X-direction and a Y-direction. A direction orthogonal to the X-direction and the Y-direction is taken as a Z-direction.

The semiconductor device 1 is a vertical semiconductor device in which a current flows in the semiconductor part 10 in the vertical direction (the Z-direction) connecting the upper electrode 62 and the common electrode 61. The semiconductor device 1 also includes a gate electrode 20 having a trench gate structure for controlling the on-off operation of the current.

The semiconductor device 1 includes a first transistor Q1 and a second transistor Q2 that share the common electrode 61. The first transistor Q1 and the second transistor Q2 are adjacent in the X-direction. The first transistor Q1 and the second transistor Q2 have the same structure and are, for example, MOSFETs (Metal-Oxide-Semiconductor Field Effect Transistors). The configuration shown in FIG. 2 is a common configuration of the first and second transistors Q1 and Q2.

As shown in FIG. 1, the semiconductor part 10 includes a terminal 100, a first region 101, and a second region 102 positioned between the first region 101 and the terminal 100. The terminal 100 includes outermost perimeter side surfaces and corner portions of the semiconductor part 10. The boundary between the first region 101 and the second region 102 is schematically illustrated by double dot-dash lines. The second region 102 is formed along the terminal 100. The second region 102 is also located between a first transistor region in which the first transistor Q1 is formed and a second transistor region in which the second transistor Q2 is formed. The first region 101 is larger than the second region 102 in one semiconductor device 1.

The material of the semiconductor part 10 is, for example, silicon. Or, the material of the semiconductor part 10 may be, for example, silicon carbide, gallium nitride, etc.

Although a first conductivity type is taken to be an n-type and a second conductivity type is taken to be a p-type in the description below, the first conductivity type may be the p-type, and the second conductivity type may be the n-type.

As shown in FIG. 2, the semiconductor part 10 includes an n-type drain layer (or a semiconductor substrate) 11, an n-type drift layer (a first semiconductor layer) 12 provided on the drain layer 11, a p-type base layer (a second semiconductor layer) 13 provided on the drift layer 12, an n-type source layer (a third semiconductor layer) 14 provided on the base layer 13, and a p-type carrier removal layer (a fourth semiconductor layer) 15 provided on the base layer 13.

The n-type impurity concentration of the drift layer 12 is less than the n-type impurity concentration of the drain layer 11 and the n-type impurity concentration of the source layer 14. The p-type impurity concentration of the carrier removal layer 15 is greater than the p-type impurity concentration of the base layer 13.

Multiple gate electrodes 20 are located in the semiconductor part 10. The gate electrode 20 extends in the X-direction through the semiconductor part 10. An insulating film 31 is provided between the gate electrode 20 and the semiconductor part 10. The insulating film 31 is located between the base layer 13 and the side surface of the gate electrode 20. The side surface of the gate electrode 20 faces the base layer 13 via the insulating film 31.

The semiconductor part 10 is divided in the Y-direction by the gate electrodes 20 and includes mesa portions 70 extending in the X-direction. The base layer 13, the source layer 14, and the carrier removal layer 15 are located in the mesa portion 70. In other words, the base layer 13, the source layer 14, and the carrier removal layer 15 are located between the gate electrodes 20 adjacent to each other in the Y-direction. The source layer 14 and the carrier removal layer 15 are alternately arranged along the X-direction.

The upper electrode (the source electrode) 62 is located at the upper surface of the semiconductor part 10. The upper electrode 62 contacts the source layer 14 and the carrier removal layer 15. An insulating film 32 is provided between the upper electrode 62 and the gate electrode 20. The common electrode (the drain electrode) 61 is located at the lower surface of the semiconductor part 10.

The upper electrode 62 is divided into two on the semiconductor part 10. As illustrated by the broken lines in FIG. 1, a first source electrode 62a is formed in the first transistor region in which the first transistor Q1 is formed; and a second source electrode 62b is formed in the second transistor region in which the second transistor Q2 is formed.

For example, two first source pads S1 are located on the first source electrode 62a. The first source pads S1 are electrically connected to the first source electrode 62a. For example, two second source pads S2 are located on the second source electrode 62b. The second source pads S2 are electrically connected to the second source electrode 62b.

The common electrode 61 is not divided in one semiconductor device 1 and is provided commonly for the first transistor Q1 and the second transistor Q2.

For example, one first gate pad G1 is located on the semiconductor part 10 of the first transistor region. For example, one second gate pad G2 is located on the semiconductor part 10 of the second transistor region.

Figure 3:
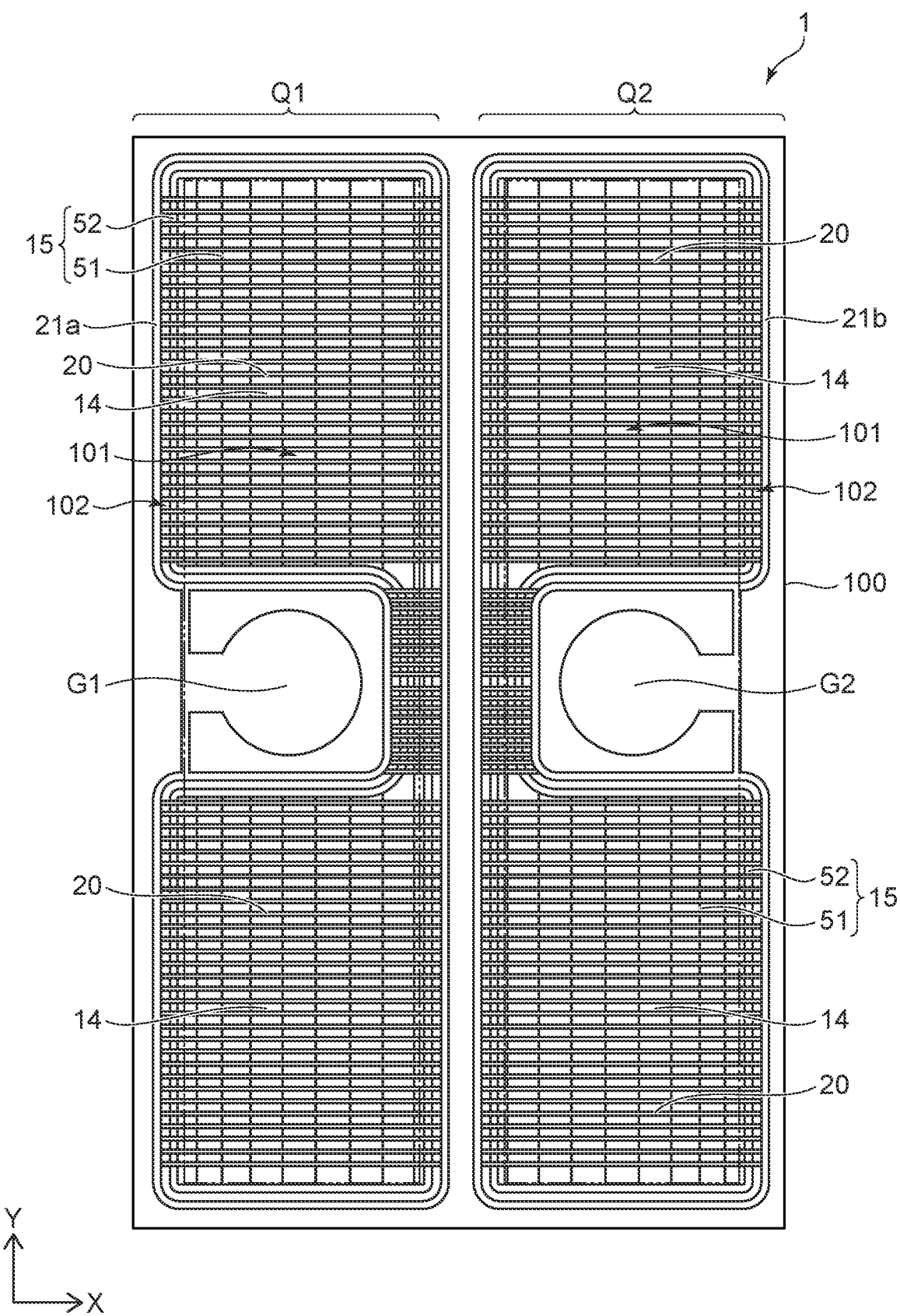
FIG. 3 is a schematic plan view showing one configuration example of the semiconductor device of the embodiment.

FIG. 3 is a schematic plan view showing the arrangement of the gate electrodes 20, gate interconnects 21a and 21b, the gate pads G1 and G2, the source layers 14, and the carrier removal layers 15 in the semiconductor device 1.

The multiple gate electrodes 20 of the first transistor Q1 extend in the X-direction. The multiple gate electrodes 20 of the first transistor Q1 are electrically connected to the first gate interconnect 21a that is formed to surround the region in which these gate electrodes 20 are located. The first gate interconnect 21a is electrically connected to the first gate pad G1. The first gate interconnect 21a is located in the second region 102 at the terminal 100 side.

The multiple gate electrodes 20 of the second transistor Q2 extend in the X-direction. The multiple gate electrodes 20 of the second transistor Q2 are electrically connected to the second gate interconnect 21b that is formed to surround the region in which these gate electrodes 20 are located. The second gate interconnect 21b is electrically connected to the second gate pad G2. The second gate interconnect 21b is located in the second region 102 at the terminal 100 side.

A channel is formed in a region of the base layer 13 facing the gate electrode 20 when a voltage that is not less than a threshold voltage is applied to the gate electrode 20. The gate electrodes 20 of the first transistor Q1 and the gate electrodes 20 of the second transistor Q2 can be electrically controlled independently from each other.

Figure 6:
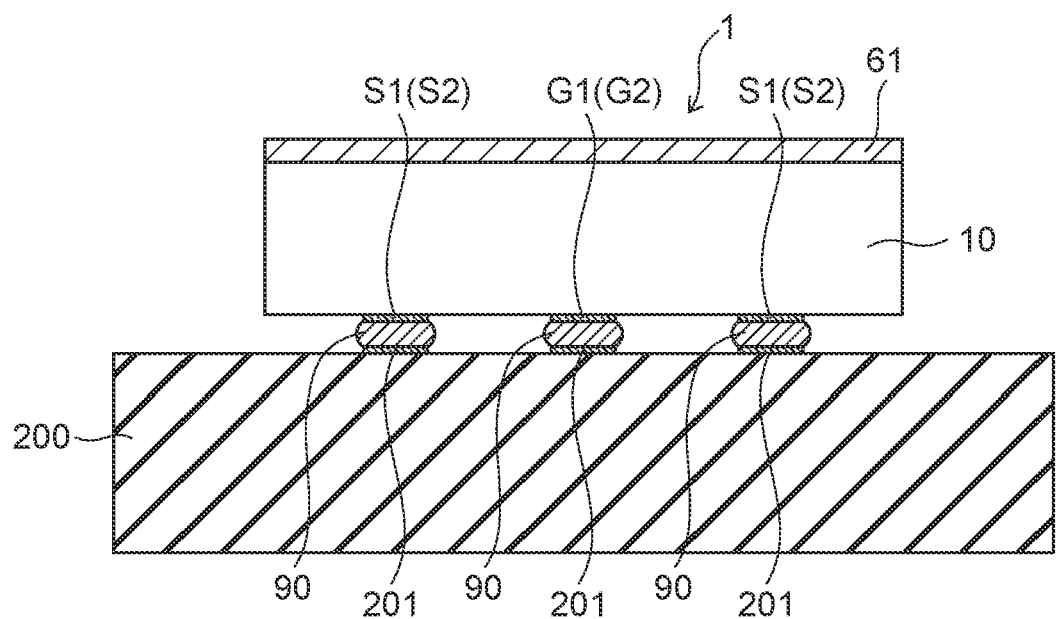
FIG. 6 is a schematic cross-sectional view of the semiconductor device of the embodiment mounted on a wiring substrate.

FIG. 6 is a schematic cross-sectional view of a state in which the semiconductor device 1 is mounted on a wiring substrate 200.

The semiconductor device 1 is mounted on the wiring substrate 200 in a state in which the common electrode 61 faces upward. The first source pad S1, the second source pad S2, the first gate pad G1, and the second gate pad G2 of the semiconductor device 1 are bonded to a conductor part 201 of the wiring substrate 200 via a bonding member (e.g., solder) 90.

For example, the semiconductor device 1 of the embodiment is embedded in a charging/discharging circuit, and can be used as a switch that controls the conduction of bidirectional current of the charging and discharging. The first transistor Q1 and the second transistor Q2 share a drain part (the drain layer 11 and the common electrode 61); and the first source electrode 62a of the first transistor Q1 and the second source electrode 62*b* of the second transistor Q2 are connected respectively to terminals that are electrically independent (having different potentials applied). A current flows between the first transistor Q1 and the second transistor Q2 via the common electrode 61.

There are cases where a parasitic transistor Tr shown in FIG. 2 operates at turn-off when the application of the voltage that is not less than the threshold voltage to the gate electrode 20 is stopped. The parasitic transistor Tr is an n-p-n transistor in which the drift layer 12 is a collector, the source layer 14 is an emitter, and the base layer 13 is a base.

At turn-off, a steep drain-source voltage change (dv/dt) occurs; a base current IB of the parasitic transistor Tr flows via a capacitance between the base layer 13 and the drift layer 12; a base-emitter potential VBE occurs; and the parasitic transistor Tr is switched on. When the parasitic transistor Tr is switched on, a current path other than the original current path of the MOSFET controlled by the gate electrode 20 is formed and may cause breakdown.

If it is difficult to remove the holes accumulated in the base layer 13 to the upper electrode (the source electrode) 62 via the carrier removal layer 15 at turn-off, a base-emitter potential VBE that is sufficient to switch the parasitic transistor Tr on undesirably occurs even at a low base current IB.

The increase of the surface area of the carrier removal layer 15 is an example of one countermeasure to suppress the occurrence of the base-emitter potential VBE that switches the parasitic transistor Tr on. However, when the surface area of the carrier removal layer 15 is increased, there is a trade-off relationship in which the surface area of the source layer 14 is relatively reduced and the on-resistance is undesirably increased.

In the semiconductor part 10, a large electric field is applied and the current easily concentrates in the regions proximate to the terminal 100 including the corner portions; in particular, there is a tendency for breakdown to easily occur in regions proximate to the terminal 100.

Therefore, in the embodiment, a ratio M of the surface area of the carrier removal layer 15 to the surface area of the source layer 14 in the second region 102 proximate to the terminal 100 is set to be greater than a ratio N of the surface area of the carrier removal layer 15 to the surface area of the source layer 14 in the first region 101 further inward of the second region 102. The ratio M per unit area in the second region 102 is greater than the ratio N per unit area in the first region 101.

For example, as shown in FIG. 3, the carrier removal layer 15 includes a first portion 51 that is located in the first region 101, and a second portion 52 that is located in the second region 102. The second portion 52 is formed along the gate interconnects 21*a* and 21*b* at the vicinity of the gate interconnects 21*a* and 21*b*. The gate interconnects 21*a* and 21*b* are located between the second portion 52 and the terminal 100. The first portion 51 is shown by the thick solid line in the Y-direction in FIG. 3. In other words, the width in the X-direction of the first portion 51 is the width of the thick solid line.

In the first region 101, the first portions 51 extend (are arranged) in the Y-direction in a broken line configuration separated by the gate electrodes 20. The second portions 52 also extend (are arranged) in the Y-direction in a broken line configuration separated by the gate electrodes 20. The width in the X-direction of the portion of the second portion 52 extending in the Y-direction is greater than the width in the X-direction of the first portion 51. The portion of the second portion 52 that extends in the X-direction, which is the direction in which the gate electrodes 20 extend, is not divided and is continuous. The width in the Y-direction of the portion of the second portion 52 continuously extending in the X-direction is greater than the width in the X-direction of the first portion 51.

By setting the width of the second portion 52 located in the second region 102 to be greater than the width of the first portion 51 located in the first region 101, the holes of the base layer 13 in the second region 102 are easily removed to the upper electrode 62 via the carrier removal layer 15. Thereby, at turn-off, the operation of the parasitic transistor Tr that easily occurs in the regions proximate to the terminal 100 can be suppressed, and the breakdown immunity can be increased. The ratio per unit area of the source layer 14 in the first region 101 can be relatively greater than that of the second region 102 by setting the width of the first portion 51 located in the first region 101, which is larger than the second region 102 and occupies the greater part of the region of the semiconductor device 1 in which the channel is formed, to be less than the width of the second portion 52; and the increase of the on-resistance can be suppressed thereby.

Figure 4:
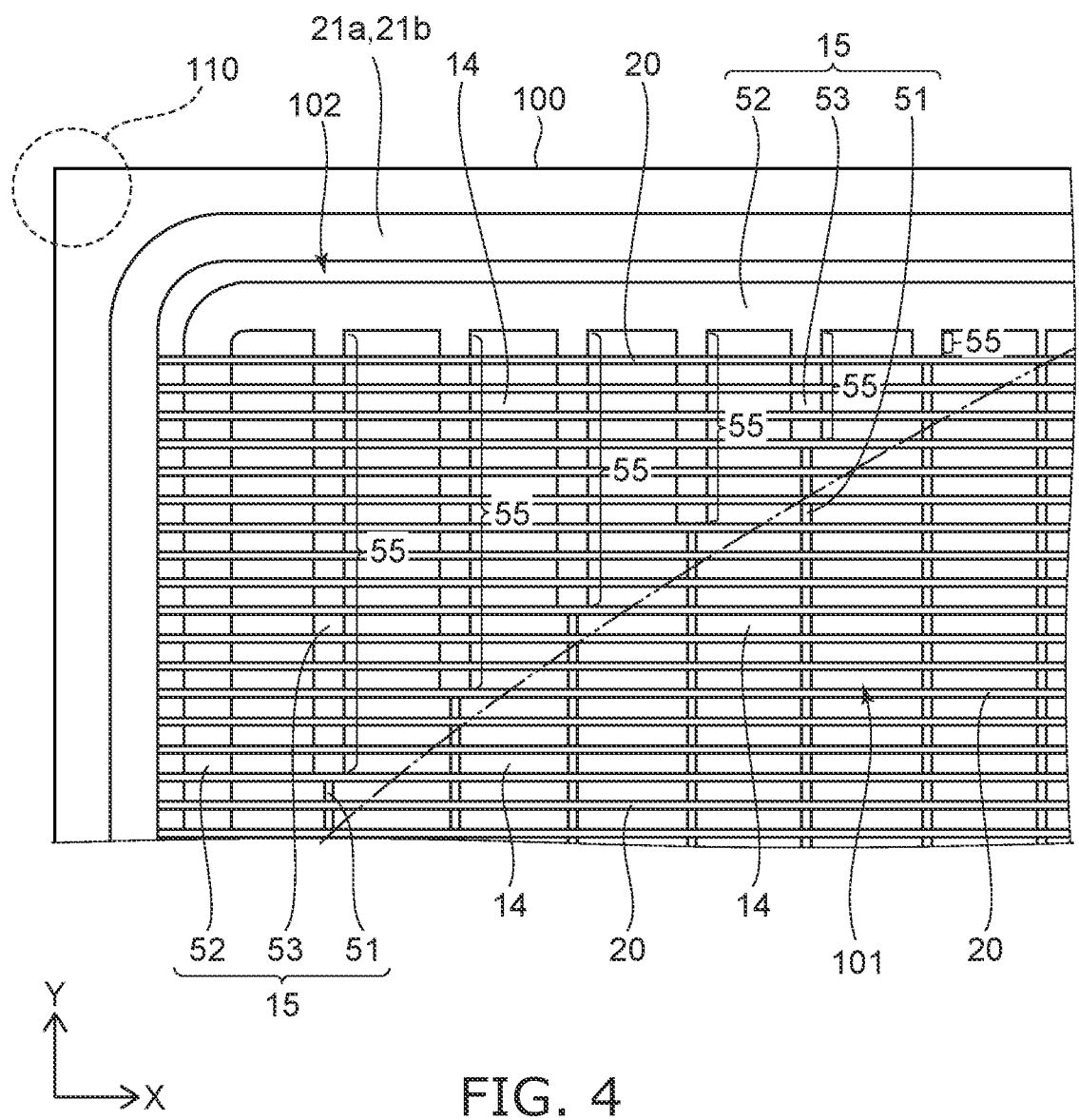
FIG. 4 is a schematic plan view showing one configuration example at a vicinity of a corner portion of the semiconductor part of the embodiment.

FIG. 4 is a schematic plan view showing one configuration example at the vicinity of a corner portion 110 of the semiconductor part 10.

In addition to the first portion 51 located in the first region 101 described above and the second portion 52 located in the second region 102 described above, the carrier removal layer 15 further includes a third portion 53 that is located proximate to the corner portion 110 in the second region 102 and links the first portion 51 and the second portion 52. The multiple gate electrodes 20 and the multiple third portions 53 are alternately arranged in the Y-direction, which crosses (e.g., is orthogonal to) the X-direction in which the gate electrodes 20 extend.

The width in the X-direction of the second portion 52 and the width in the X-direction of the third portion 53 are greater than the width in the X-direction of the first portion 51. The length in the Y-direction of a region 55 in which the multiple third portions 53 are arranged in the Y-direction with the gate electrodes 20 interposed increases for the regions 55 toward the corner portion 110. The Y-direction lengths increase in stages as the regions 55 approach the corner portion 110 in the X-direction.

By such a configuration, the operation of the parasitic transistors Tr that easily occurs particularly in regions proximate to the corner portion 110 can be suppressed, and the breakdown immunity can be increased.

Figure 5:
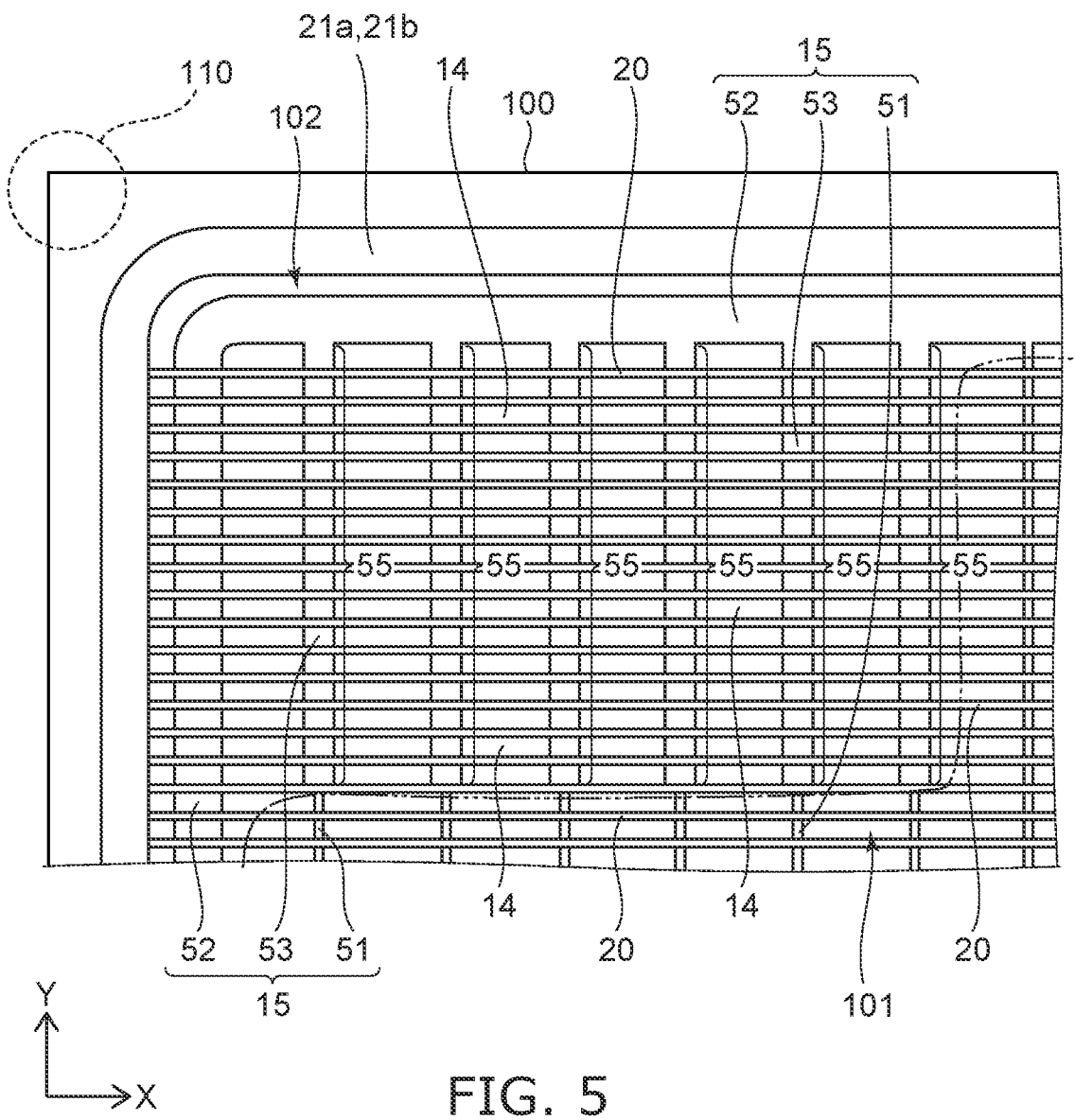
FIG. 5 is a schematic plan view showing one configuration example at a vicinity of a corner portion of the semiconductor part of the embodiment.

Also, as shown in FIG. 5, the lengths in the Y-direction of the multiple regions 55 located proximate to the corner portion 110 may be equal to each other.

Figure 7:
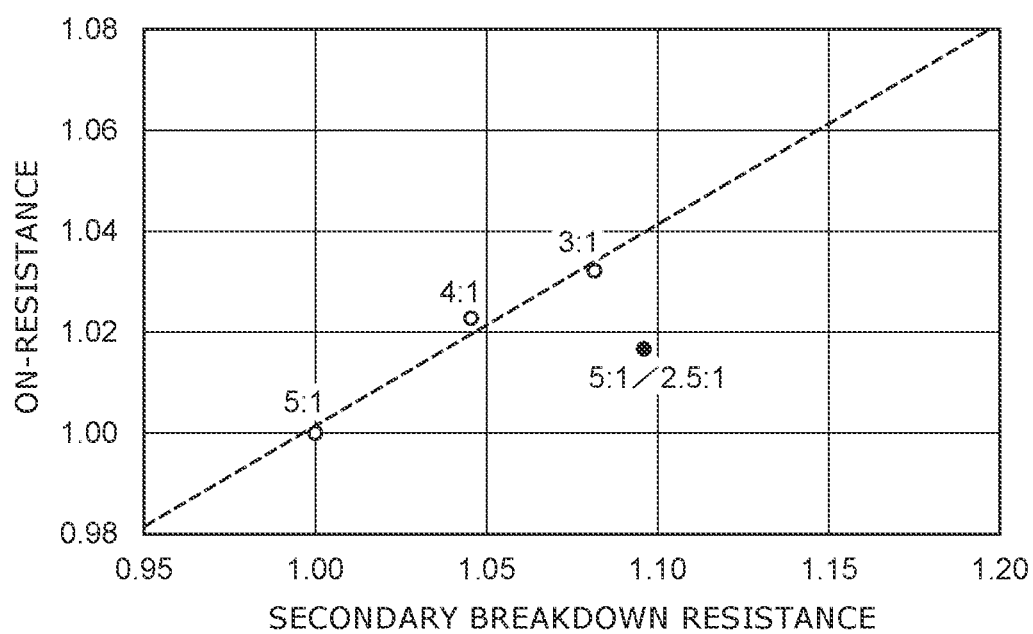
FIG. 7 is a graph showing measurement results of an on-resistance and a secondary breakdown resistance of a semiconductor device.

FIG. 7 is a graph showing measurement results of an on-resistance and a secondary breakdown resistance of a semiconductor device.

White circles in the graph of FIG. 7 shows measurement results in a semiconductor device of a comparative example. Let N:P be the ratio of the area N of the source layer 14 to the ratio of the area P of the carrier removal layer 15. In the semiconductor device of the comparative example, the ratio N:P in the second region 102 and the ratio N:P in the first region 101 are the same. In the comparative example, the measurement values were measured when the ratio was 5:1, the ratio was 4:1, and the ratio was 3:1.

The measured value of the secondary breakdown resistance when the ratio N:P is 5:1 in the comparative example is set as the reference value (1.00). The secondary breakdown resistance on the horizontal axis of the graph of FIG.

7 represents a ratio to the reference value. The measured value of the on-resistance when the ratio N:P is 5:1 in the comparative example is set as the reference value (1.00). The on-resistance on the vertical axis of the graph of FIG. 7 represents a ratio to the reference value.

In the comparative example, the on-resistance and the secondary breakdown resistance change along the broken line shown in FIG. 7 as the ratio of the area N of the source layer 14 to the area P of the carrier removal layer 15 increases or decreases. In the comparative example, if the ratio of the area N of the source layer 14 to the area P of the carrier removal layer 15 is low, the secondary breakdown resistance is high, but the on-resistance is also high. In the comparative example, if the ratio of the area N of the source layer 14 to the area P of the carrier removal layer 15 is high, the on-resistance is low, but the secondary breakdown resistance is also low.

Figure 8:
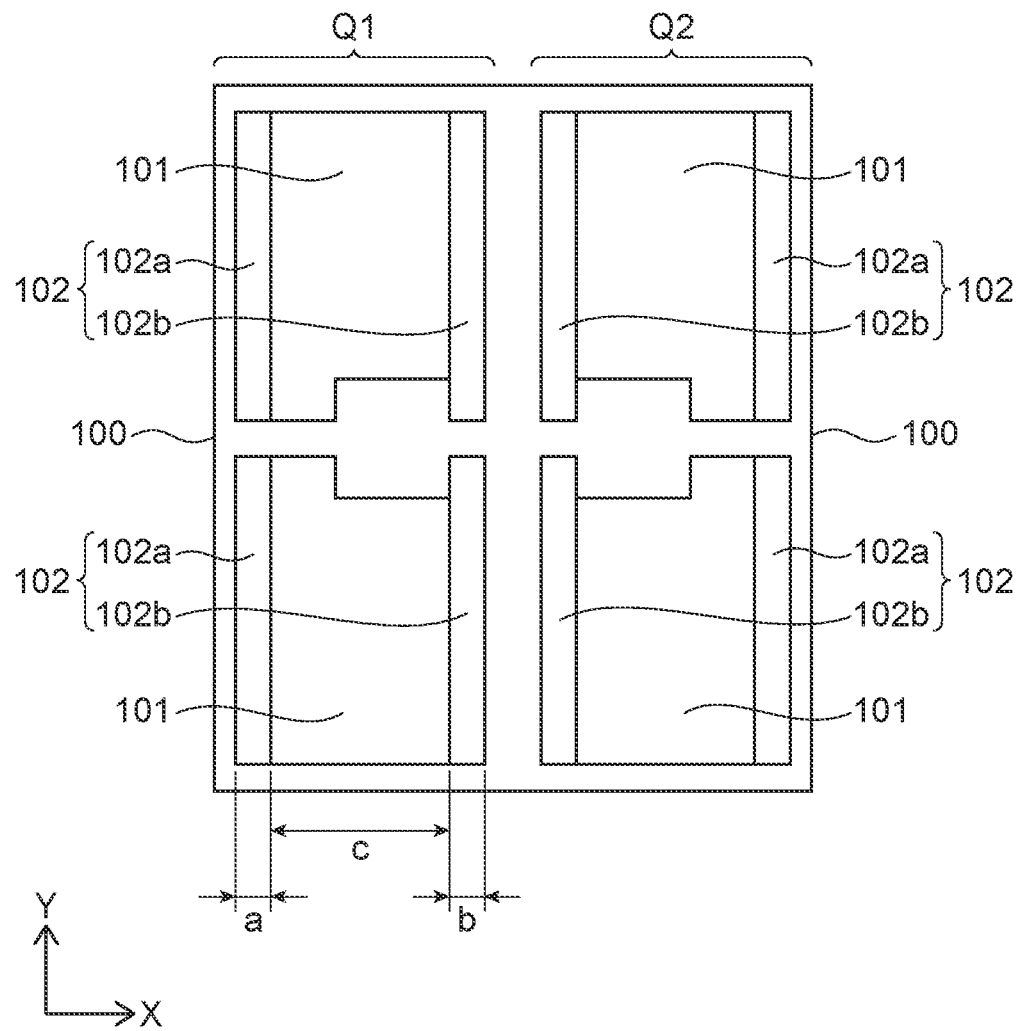
FIG. 8 is a schematic plan view showing an array example of a first region and a second region of the semiconductor device of the embodiment.

In the graph of FIG. 7, a black circle shows a measured value of on-resistance and secondary breakdown resistance in the semiconductor device of the embodiment. FIG. 8 shows an array example of the first region 101 and the second region 102 in the semiconductor device in which the measured value (black circle) is measured.

The first transistor Q1 and the second transistor Q2 are arranged in the X-direction. The first transistor Q1 was divided into three regions in the X-direction. The second transistor Q2 was also divided into the three regions in the X-direction. The three regions includes the first region 101, the second region 102a on the terminal 100 side, and the second region 102b on the boundary side between the first transistor Q1 and the second transistor Q2.

In each of the first transistor Q1 and the second transistor Q2, the ratio of the length a of the second region 102a in the X-direction, the length b of the second region 102b in the X-direction, and the length c of the first region 101 in the X-direction is 1:1:7. The area of the first region 101 is 5.5 times the area of the second region 102a and 5.5 times the area of the second region 102b.

In the semiconductor device of the embodiment, the ratio N:P in the first region 101 is 5:1, the ratio N:P in the second region 102a is 5:1, and the ratio N:P in the second region 102b is 5:1. In the semiconductor device of the embodiment, the ratio of the area P of the carrier removal layer 15 to the area N of the source layer 14 in the second region 102 is larger than the ratio of the area P of the carrier removal layer 15 to the area N of the source layer 14 in the first region 101.

From the results of FIG. 7, the semiconductor device of the embodiment makes it possible to achieve both a reduction in the on-resistance and an increase in the secondary breakdown resistance as compared with the comparative example in which the ratio N:P is the same in the first region 101 and the second region 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor part including
      an outer perimeter,
      a first region,
      a second region positioned between the first region and the outer perimeter,
      a first semiconductor layer of an n-type,
      a second semiconductor layer provided on the first semiconductor layer, the second semiconductor layer being of a p-type,
      a third semiconductor layer provided on the second semiconductor layer, the third semiconductor layer being of the n-type, and
      a fourth semiconductor layer provided on the second semiconductor layer, the fourth semiconductor layer being of the p-type and having a higher p-type impurity concentration than the second semiconductor layer,
      a ratio of a surface area of the fourth semiconductor layer to a surface area of the third semiconductor layer in the second region being greater than a ratio of a surface area of the fourth semiconductor layer to a surface area of the third semiconductor layer in the first region;
   a gate electrode provided in the semiconductor part, the gate electrode including a side surface facing the second semiconductor layer;
   an insulating film provided between the semiconductor part and the side surface of the gate electrode; and
   an upper electrode provided on the semiconductor part, the upper electrode contacting the third and fourth semiconductor layers, wherein
   the fourth semiconductor layer includes:
      a first portion located in the first region;
      a second portion located in the second region; and
      a third portion located in the second region, the third portion linking the first portion and the second portion, and
   a width of the second portion and a width of the third portion are greater than a width of the first portion.

2. The device according to claim 1, wherein
   the fourth semiconductor layer includes:
      a first portion located in the first region; and
      a second portion located in the second region, and
   a width of the second portion is greater than a width of the first portion.

3. The device according to claim 1, wherein
   the gate electrodes extend in a first direction,
   in the second region, a plurality of sub-regions are arranged in a second direction crossing the first direction, each of the sub-regions extends in a third direction crossing the first and second direction and including a plurality of the gate electrodes and a plurality of the third portions that are alternately arranged in the third direction, and
   lengths of the sub-regions in the third direction are longer toward a corner portion of the semiconductor part.

4. The device according to claim 1, wherein
   the first region is larger than the second region.

5. The device according to claim 1, further comprising:
   a common electrode, a first gate pad, and a second gate pad,
   the upper electrode including a first source electrode and a second source electrode separated from each other and located on the semiconductor part, the first gate pad being connected to the gate electrode of a first transistor region, the first source electrode being located in the first transistor region, the second gate pad being connected to the gate electrode of a second transistor region, the second source electrode being located in the second transistor region, the common electrode being located at a lower surface of the semiconductor part commonly for both of the first and second transistor regions.

6. The device according to claim 1, wherein
a ratio of an area of the third semiconductor layer to an area of the fourth semiconductor layer in the first region is 5:1,
a ratio of an area of the third semiconductor layer to an area of the fourth semiconductor layer in the second region is 2.5:1.

7. A semiconductor device, comprising:
an upper electrode;
a lower electrode;
a first semiconductor layer provided in an outer perimeter of the semiconductor device, in a first region of the semiconductor device, and in a second region of the semiconductor device positioned between the first region and the outer perimeter, the first semiconductor layer being of an n-type and being positioned between the upper electrode and the lower electrode;
a second semiconductor layer provided between the upper electrode and the first semiconductor layer, the second semiconductor layer being of a p-type;
a third semiconductor layer provided between the upper electrode and the second semiconductor layer to contact the upper electrode, the third semiconductor layer being of the n-type, a plurality of the third semiconductor layers being arranged in a second direction crossing a first direction, the first direction being from the lower electrode toward the upper electrode;
a fourth semiconductor layer provided between the upper electrode and the second semiconductor layer to contact the upper electrode, the fourth semiconductor layer being of the p-type, a plurality of the fourth semiconductor layers being arranged in the second direction, a width in the second direction of the fourth semiconductor layer in the second region being greater than a width in the second direction of the fourth semiconductor layer in the first region;
a gate electrode including a side surface facing the second semiconductor layer;
an insulating film provided between the side surface of the gate electrode and the second, third, and fourth semiconductor layers;
a first gate pad; and
a second gate pad, wherein
the upper electrode includes a first source electrode and a second source electrode separated from each other,
the first gate pad is connected to the gate electrode of a first transistor region, the first source electrode is located in the first transistor region,
the second gate pad is connected to the gate electrode of a second transistor region, the second source electrode is located in the second transistor region, and
the lower electrode is provided commonly for both of the first and second transistor regions.

8. The device according to claim 7, wherein
the first region is larger than the second region.

9. The device according to claim 7, wherein
a p-type impurity concentration of the fourth semiconductor layer is greater than a p-type impurity concentration of the second semiconductor layer.

10. The device according to claim 7, wherein
a ratio of an area of the third semiconductor layer to an area of the fourth semiconductor layer in the first region is 5:1,
a ratio of an area of the third semiconductor layer to an area of the fourth semiconductor layer in the second region is 2.5:1.

11. A semiconductor device, comprising:
a semiconductor part including
an outer perimeter,
a first region,
a second region positioned between the first region and the outer perimeter,
a first semiconductor layer of a first conductivity type,
a second semiconductor layer provided on the first semiconductor layer, the second semiconductor layer being of a second conductivity type,
a third semiconductor layer provided on the second semiconductor layer, the third semiconductor layer being of the first conductivity type, and
a fourth semiconductor layer provided on the second semiconductor layer, the fourth semiconductor layer being of the second conductivity type and having a higher second-conductivity-type impurity concentration than the second semiconductor layer,
a ratio of a surface area of the fourth semiconductor layer to a surface area of the third semiconductor layer in the second region being greater than a ratio of a surface area of the fourth semiconductor layer to a surface area of the third semiconductor layer in the first region;
a plurality of gate electrodes provided in the semiconductor part, the plurality of gate electrodes including side surfaces facing the second semiconductor layer, the plurality of gate electrodes extending in a first direction;
a plurality of insulating films provided between the semiconductor part and the side surfaces of the plurality of gate electrodes; and
an upper electrode provided on the semiconductor part, the upper electrode contacting the third and fourth semiconductor layers, wherein
the fourth semiconductor layer includes:
a plurality of first portions located in the first region;
a second portion located in the second region; and
a plurality of third portions located in the second region, the third portion linking the first portion and the second portion,
the plurality of gate electrodes and the plurality of third portions are alternately arranged in a second direction crossing the first direction, and
a width in the first direction of each of the plurality of third portions is greater than a width in the first direction of each of the plurality of first portions.

12. The device according to claim 11, wherein
lengths of regions that each include the plurality of the third portions arranged in the second direction with one of the plurality of gate electrodes interposed in the second direction are longer toward a corner portion of the semiconductor part.

* * * * *